United States Patent
Bindseil (10) Patent No.: US 11,152,858 B2
(45) Date of Patent: Oct. 19, 2021

(54) CIRCUIT AND METHOD FOR DAMPING SUPPLY-VOLTAGE-INDUCED OSCILLATIONS IN THE INPUT CIRCUIT OF A DC-TO-DC CONVERTER

(71) Applicant: WAGO VERWALTUNGSGESELLSCHAFT MBH, Minden (DE)

(72) Inventor: Walter Bindseil, Bielefeld (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 16/813,256

(22) Filed: Mar. 9, 2020

(65) Prior Publication Data

US 2020/0212803 A1    Jul. 2, 2020

Related U.S. Application Data (63) Continuation of application No. PCT/IB2018/000816, filed on Jul. 30, 2018.

(30) Foreign Application Priority Data

Sep. 8, 2017  (DE) .................... 20 2017 004 715.2

(51) Int. Cl.
  *H02M 3/15*   (2006.01)
  *H02M 3/158*  (2006.01)
  *H02M 3/07*   (2006.01)

(52) U.S. Cl.
  CPC ............. *H02M 3/158* (2013.01); *H02M 3/07* (2013.01)

(58) Field of Classification Search
  CPC .......... H02M 3/158; H02M 3/07; H02M 1/15; H02M 1/32; H03G 11/00; H03G 1/007; H03G 1/0035; G01R 31/002; G01R 31/14
  See application file for complete search history.

(56) References Cited

U.S. PATENT DOCUMENTS

| 4,843,515 A | 6/1989 | Richman |
| 6,097,158 A | 8/2000 | Manor et al. |

(Continued)

FOREIGN PATENT DOCUMENTS

| DE | 102010017303 A1 | 8/2011 |
| WO | WO2011085703 A1 | 7/2011 |

OTHER PUBLICATIONS

International Search Report dated Nov. 6, 2018 in corresponding application PCT/IB2018/000816.

(Continued)

*Primary Examiner* — Emily P Pham
(74) *Attorney, Agent, or Firm* — Muncy, Geissler, Olds & Lowe, P.C.

(57) ABSTRACT

A circuit having a DC-to-DC converter and an input circuit connected on the line side of the DC-to-DC converter, having a first terminal and a second terminal for connection to a power supply and a third terminal and a fourth terminal for connection to the DC-to-DC converter. Between the first and third terminals, the input circle has a semiconductor element, wherein a first component terminal of the semiconductor element is connected via at least a first capacitor and a second capacitor to a second component terminal of the semiconductor element, wherein a resistance of the semiconductor element is controllable by a voltage between the first component terminal and the second component terminal.

15 Claims, 7 Drawing Sheets

(56) References Cited

U.S. PATENT DOCUMENTS

| | | | |
|---|---|---|---|
| 6,611,410 B1 | 8/2003 | Makaran | |
| 7,622,905 B2 * | 11/2009 | Huang | G05F 1/56 323/274 |
| 2006/0214599 A1 | 9/2006 | Ogawa | |
| 2012/0313428 A1 | 12/2012 | Kuniyoshi | |

OTHER PUBLICATIONS

Written Opinion of the International Searching Authority dated Nov. 6, 2018 in corresponding application PCT/IB2018/000816.

* cited by examiner

CIRCUIT AND METHOD FOR DAMPING SUPPLY-VOLTAGE-INDUCED OSCILLATIONS IN THE INPUT CIRCUIT OF A DC-TO-DC CONVERTER

This nonprovisional application is a continuation of International Application No. PCT/162018/000816, which was filed on Jul. 30, 2018, and which claims priority to German Patent Application No. 20 2017 004 715.2, which was filed in Germany on Sep. 8, 2017, and which are both herein incorporated by reference.

BACKGROUND OF THE INVENTION

Field of the Invention

The present invention relates to a circuit and a method for damping/avoidance of supply voltage induced oscillations in an input circuit of a DC-to-DC converter during impulse voltage robustness testing.

Description of the Background Art

Figure 1:
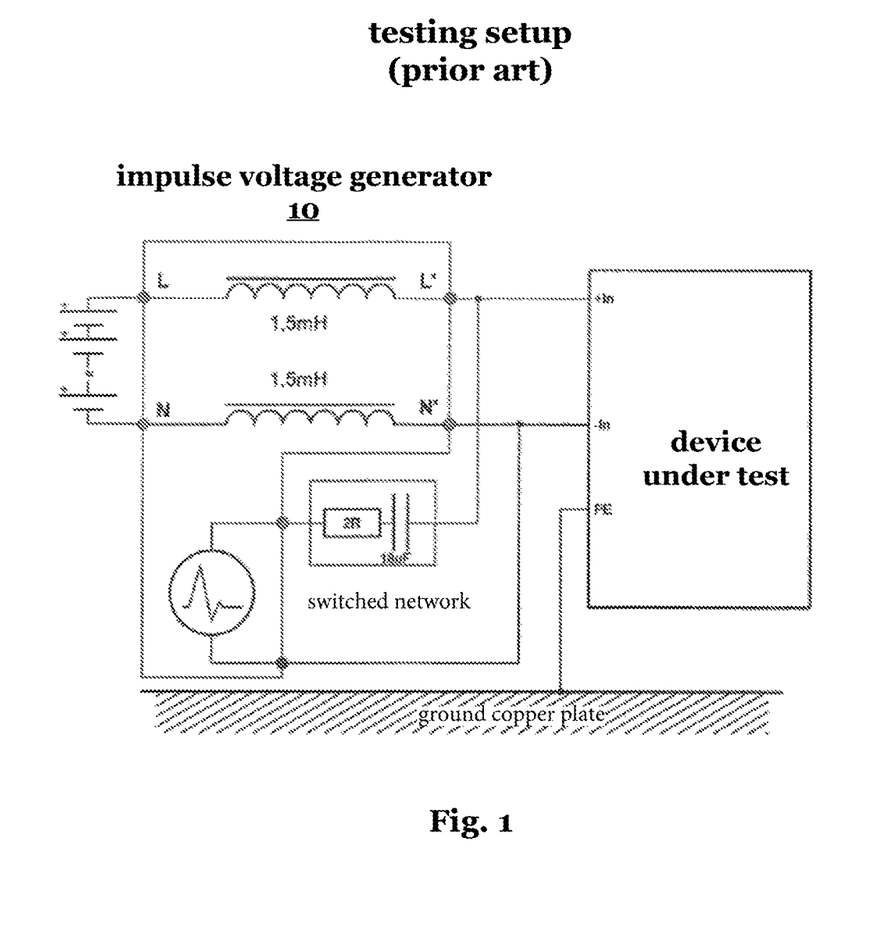
FIG. 1 is a diagram of an exemplary testing setup (according to the prior art) for impulse voltage testing.

DIN EN 61000-4-5 calls for testing and the demonstration of robustness of electrical devices against surges from the power supply. For this purpose, FIG. 1 shows the circuit diagram of an exemplary testing setup (according to the prior art) for impulse voltage testing. The generated impulse voltage amplitudes are typically between 0.5 kV and 6 kV.

The impulse generator used for testing has internal decoupling inductances which serve to protect the testing system and ensure that the impulse voltage energy is concentrated towards the DUT, "device under test". In conjunction with the negative differential input resistance and the input capacity of a DC-to-DC converter, oscillations can be caused which complicate testing or damage the device under test during testing.

SUMMARY OF THE INVENTION

It is therefore an object of the present invention to provide an input circuit that sufficiently damp oscillations created during testing by temporarily increasing the resistance of a semiconductor element arranged in the input circuit during voltage fluctuations.

For example, the voltage-dependent pinch-off property of a reverse polarity metal oxide semiconductor field effect transistor (reverse polarity MOSFET) can be used by temporarily increasing the resistance of the MOSFET during an upswing phase such that the resonant circuit (formed of decoupling inductances of the impulse generator, input capacity and negative input resistance of the DC-to-DC converter) is damped. The degree of damping can also be adapted to the expected oscillation amplitude and the expected frequency by adding resistors and capacitors.

This makes testing according to DIN EN 61000-4-5 possible without making significant changes to the testing setup and without having to intervene or alter the product and in particular without having to accept restrictions in respect of the operating conditions.

An exemplary circuit includes a DC-to-DC converter and an input circuit on the line side of the DC-to-DC converter, which comprises a first terminal and a second terminal for connection to a power supply and a third terminal and a fourth terminal for connection to the DC-to-DC converter.

The input circuit comprises a semiconductor element between the first and third terminal, wherein a first component terminal of the semiconductor element is connected to a second component terminal of the semiconductor element by means of a first capacitor and a second capacitor, and a resistor of the semiconductor element can be controlled by means of a voltage between the first component terminal and the second component terminal.

The term "semiconductor element" as used in the specification and the claims can be understood to be, for example, as an electronic component which is at least partially made of semiconductor material. Further, the term "DC-to-DC converter" as used in the specification and the claims can be understood, for example, to be a circuit which converts a supplied DC voltage into a DC voltage with a higher, lower or inverted voltage level.

The semiconductor element can be configured as a field effect transistor, FET, and preferably configured as a reverse polarity protection semiconductor switch.

Here, the term "reverse polarity protection semiconductor switch" as it is used in the specification and the claims can be understood, for example, to be a semiconductor element which interrupts the circuit when an electrical voltage of reverse polarity is applied to the circuit.

A gate terminal of the FET can be connected to a first component terminal of the first capacitor and connected to the source terminal of the FET via a resistor of a voltage divider circuit connected in parallel with the first capacitor, a second component terminal of the first capacitor and a second component terminal of a second capacitor are connected to the second terminal, and a source terminal of the FET is connected to a first component terminal of the second capacitor.

The FET can be configured as a metal oxide semiconductor field effect transistor, MOSFET.

The first terminal can be connected to a first pole of the impulse voltage generator and the second terminal to a second pole of the impulse voltage generator, which has decoupling inductances.

The first and second capacitors can be configured for damping an oscillation generated by applying a voltage to the DC-to-DC converter in a resonant circuit comprising the decoupling inductances by a voltage fluctuation-dependent increase in the resistance of the semiconductor element, wherein the damping is configured to avoid an undervoltage cut-off of the DC-to-DC converter and/or an overload at an input protection diode.

An inventive method for testing a circuit for robustness against impulse voltages includes the application of a voltage to an input circuit of the circuit, wherein the input circuit comprises a semiconductor element, and the damping of an oscillation generated by the application of the voltage in the input circuit, which causes a voltage fluctuation in the input circuit, wherein the damping includes an increase in the resistance of the semiconductor element controlled by the voltage fluctuation.

The semiconductor element can be configured as a field effect transistor, FET, and particularly preferably, as a reverse polarity protection semiconductor switch.

Preferably, the increase in resistance controlled by the voltage fluctuation comprises a voltage fluctuation-dependent reduction in a gate-source voltage applied to the FET, which causes a temporal delay in the drop of a gate potential.

A drain terminal of the FET can be connected to a first pole of a voltage source and a gate terminal of the FET is connected by means of a capacitor to a second pole of the voltage source, wherein the time delay of the drop in the gate potential is brought about by charging/discharging the capacitor via a resistor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 2:
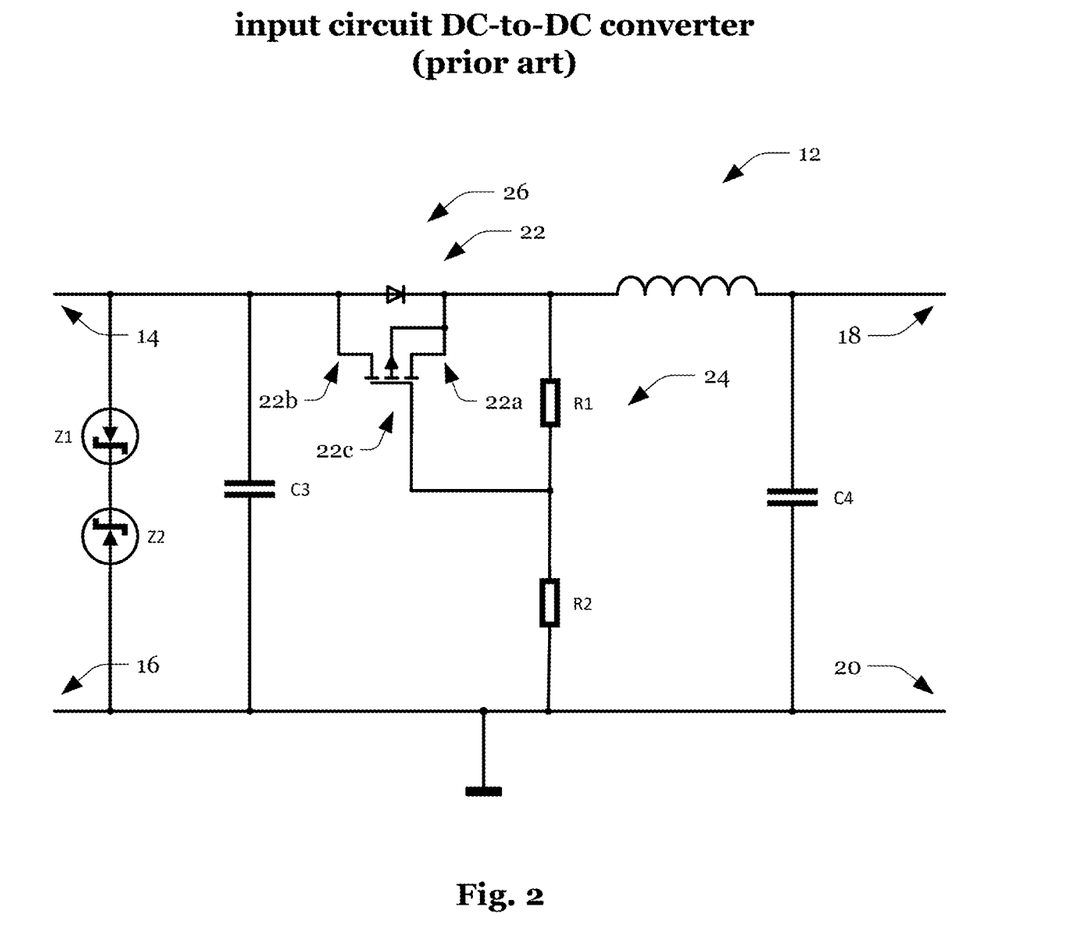
FIG. 2 is a circuit diagram of an input circuit which can be connected on the line side of a DC-to-DC converter with reverse polarity protection and a filter for wired interference emission (according to the prior art)

FIG. 2 schematically illustrates a possible embodiment of an input circuit 12 of a DC-to-DC converter. The input circuit 12 comprises a first terminal 14 and a second terminal 16 for connection to a power supply (for example, 24 V). The input circuit 12 further comprises a third terminal 18 and a fourth terminal 20 for connection to the DC-to-DC converter. The first terminal 14 is connected to the third terminal 18 by means of the drain terminal 22b and the source terminal 22a of a semiconductor element 22 (FET or reverse polarity protection MOSFET).

As shown in FIG. 2, the gate terminal 22c is connected by means of the voltage divider circuit 24 to the first terminal 14 and to the second terminal 16, so that the gate potential (in quasistationary operation) is applied between the potential at the first terminal 14 and the potential at the second terminal 16 (and thus between the source potential and the ground potential). If the difference in voltage between the first terminal 14 and the second terminal 16 is sufficiently high, the channel between the source terminal 22a and the drain terminal 22b becomes conductive. In the event of wrong polarity of the first terminal 14 and the second terminal 16, the current flow through the channel and the diode 26 on the other hand is prevented. In addition, an input protection diode circuit is arranged between the first terminal 14 and the second terminal 16 for limiting the input voltage, which for example, as shown in FIG. 2, may include two Zener diodes connected in anti-series.

Figure 3:
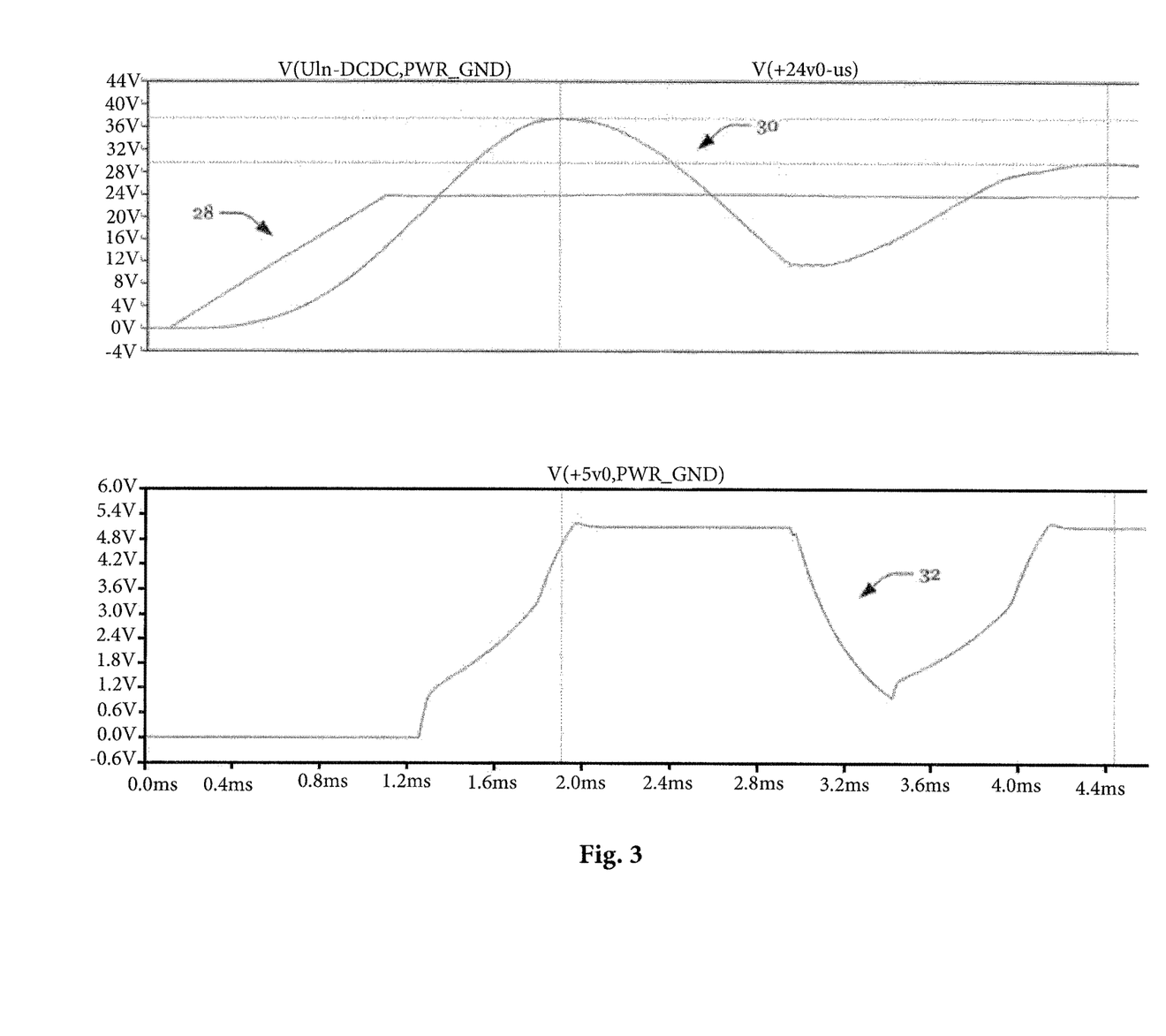
FIG. 3 shows oscillations occurring during impulse voltage testing in the input circuit of FIG. 2.

FIG. 3 shows a start-up behavior suitable for the input circuit 12 shown in FIG. 2 and for a DC-to-DC converter connected to the input circuit 12 when carrying out impulse voltage testing. After switching on the supply test voltage (input voltage of the input circuit 10) 28, starting from an input voltage 30 of 18 V, the DC-to-DC converter clocks the output voltage 32 from 0 V to 5 V.

Due to the decoupling inductances in the impulse voltage generator 10, the capacitances in the input circuit 12 and the negative input resistance of the DC-to-DC converter, an onset of oscillation of the input voltage 30 can be observed. In the negative half-wave of the oscillation amplitude, the input voltage 30 drops below 12 V and thus below the undervoltage cut-off threshold of the DC-to-DC converter. As a consequence, the output voltage 32 of the DC-to-DC converter breaks down and testing cannot continue.

Figure 4:
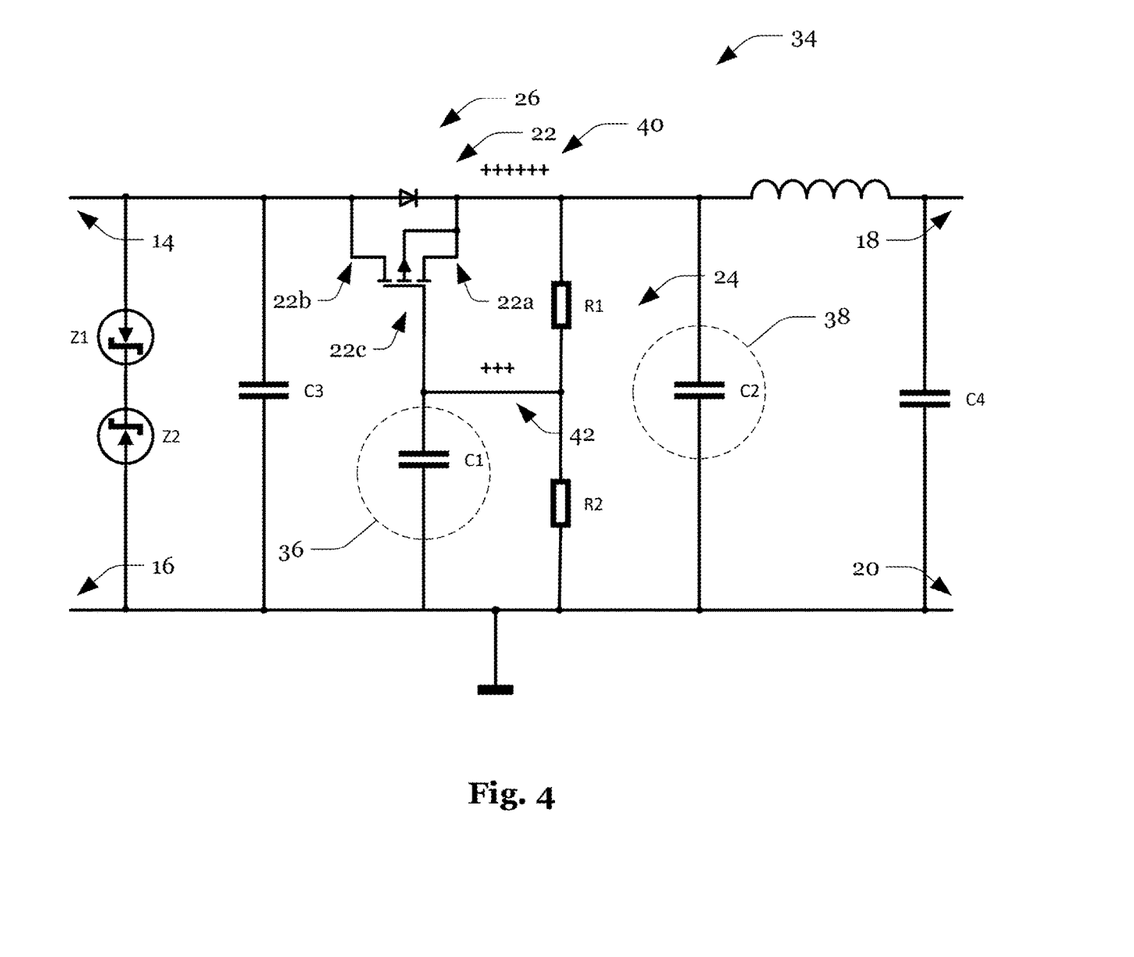
FIG. 4 shows an input circuit for damping/avoiding the oscillations which can be connected on the line side of a DC-to-DC converter.

A modified input circuit 34 for damping/avoiding such oscillations is shown in FIG. 4. The input circuit 34 comprises, as the input circuit 12 shown in FIG. 2, a first terminal 14 and a second terminal 16 for connection to a power supply and a third terminal 18 and a fourth terminal 20 for connection to the DC-to-DC converter.

The first terminal 14 is, as shown in FIG. 2, connected to the third terminal 18 by means of the drain terminal 22b and the source terminal 22a of a reverse polarity protection MOSFET 22. Similarly, the gate terminal 22c is connected to the first terminal 14 and to the second terminal 16 by means of the voltage divider circuit 24, so that the gate potential 42 (in the quasistationary operation) lies between the potential at the first terminal 14 and the potential at the second terminal 16 (and thus between the source potential 40 and the ground potential).

However, compared to the input circuit 12 shown in FIG. 2, the modified input circuit 34 is expanded by two capacitors, a first capacitor 36 between the gate terminal 22c and the second terminal 16 and a second capacitor 38 between the source terminal 22a and the second terminal 16. As shown in FIG. 4, the gate terminal 22c of the reverse polarity protection MOSFET 22 is thus connected to the source terminal 22a of the reverse polarity protection MOSFET 22 by means of the first capacitor 36 and the second capacitor 38. This creates an additional "discharge path" between the source terminal 22a and the gate terminal 22c by means of the capacitors 36, 38.

Figure 5:
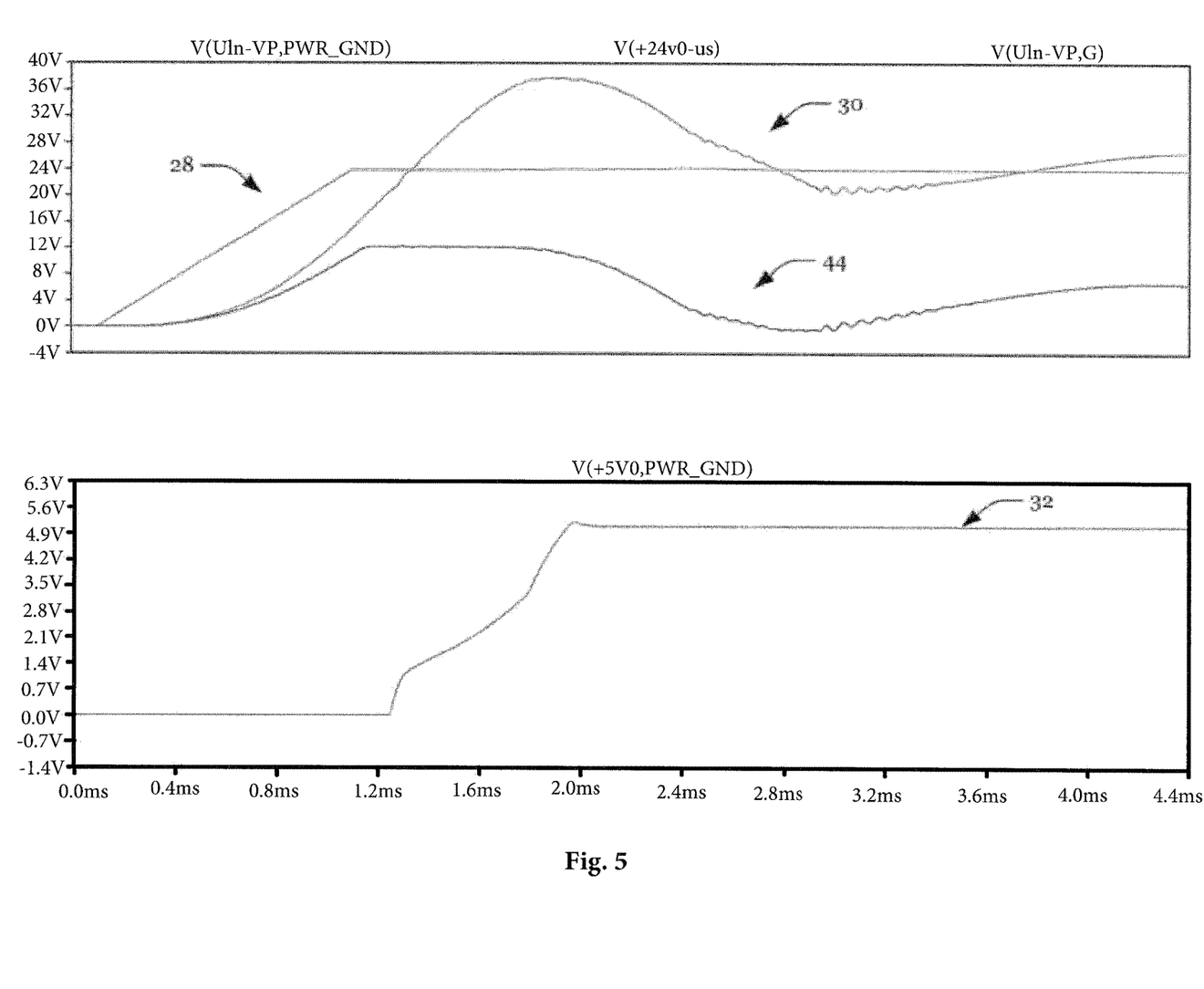
FIG. 5 shows voltages occurring during robustness testing in the input circuit of FIG. 4 and at the output of a DC-to-DC converter connected downstream of the input circuit.

As shown in FIG. 5, the source potential 40 drops during the transition of the oscillation amplitude from the positive to the negative half-wave. However, the equally decreasing gate potential 42 is supported by the first capacitor 36 that is to be discharged, whereby the gate potential 42 drops more slowly as compared to the input circuit 12 shown in FIG. 2.

In other words, the voltage drop across the resistor R2 of the voltage divider circuit 24 is delayed by the time constant R1*C1, which accelerates the voltage drop across R1. If, for example, the input voltage 30 drops by 5 V within one millisecond, then at the same time R2 "sees" a voltage drop of 1.8 V; The voltage drop across R1 is then: R1=5 V−1.8 V=3.2 V.

If the source-gate voltage was originally 5 V, it amounts to only 5 V−3.2 V=1.8 V, due to the drop in the input voltage 30. As a result, the drain-source path has become significantly more resistive. During the transition of the oscillation amplitude from the positive to the negative half-wave, the source-gate voltage 44 of the reverse polarity protection MOSFET 22 drops, as shown in FIG. 5, approximately with the same slope as the input voltage 30.

As a result, the source-gate voltage is reduced and the volume resistance of the reverse polarity protection MOSFET 22 increases between the source terminal 22a and the drain terminal 22b. By increasing the volume resistance of the reverse polarity protection MOSFET 22, the drop in the source potential is curbed, as a result of which the source gate voltage 44 again stabilizes.

This has the effect that the volume resistance is again reduced, and the source potential again drops. In FIG. 5, this behavior is outlined by the wavy portions of the input voltage 30 and the source-gate voltage 44, which indicate at what point the pinch-off behavior of the reverse polarity protection MOSFET 22 begins (or ends).

The volume resistance of the reverse polarity protection MOSFET 22 acts in this area as a damping resistor in the LC resonant circuit. In the example shown in FIG. 5, the damping is sufficient to maintain the negative half-wave of the input voltage 30 above 20 V. This way, the input voltage 30 of the DC-to-DC converter remains above the undervoltage cut-off threshold of 12 V, and the output voltage 32 of the DC-to-DC converter is continuously 5 V.

Thus, an undervoltage cut-off of the DC-to-DC converter can be avoided and testing continued. Once the oscillation transitions back into the positive half-wave, the source-gate voltage 44 is recharged and the volume resistance of the reverse polarity protection MOSFET 22 drops. The intensity of the damping can thus be set to the expected oscillation frequencies and amplitudes by means of suitable dimensioning of the resistance of the voltage divider circuit 24 and the capacitors 36, 38.

In normal operation (without any testing system with decoupling inductances), as desired, the input circuit is not affected.

Figure 6:
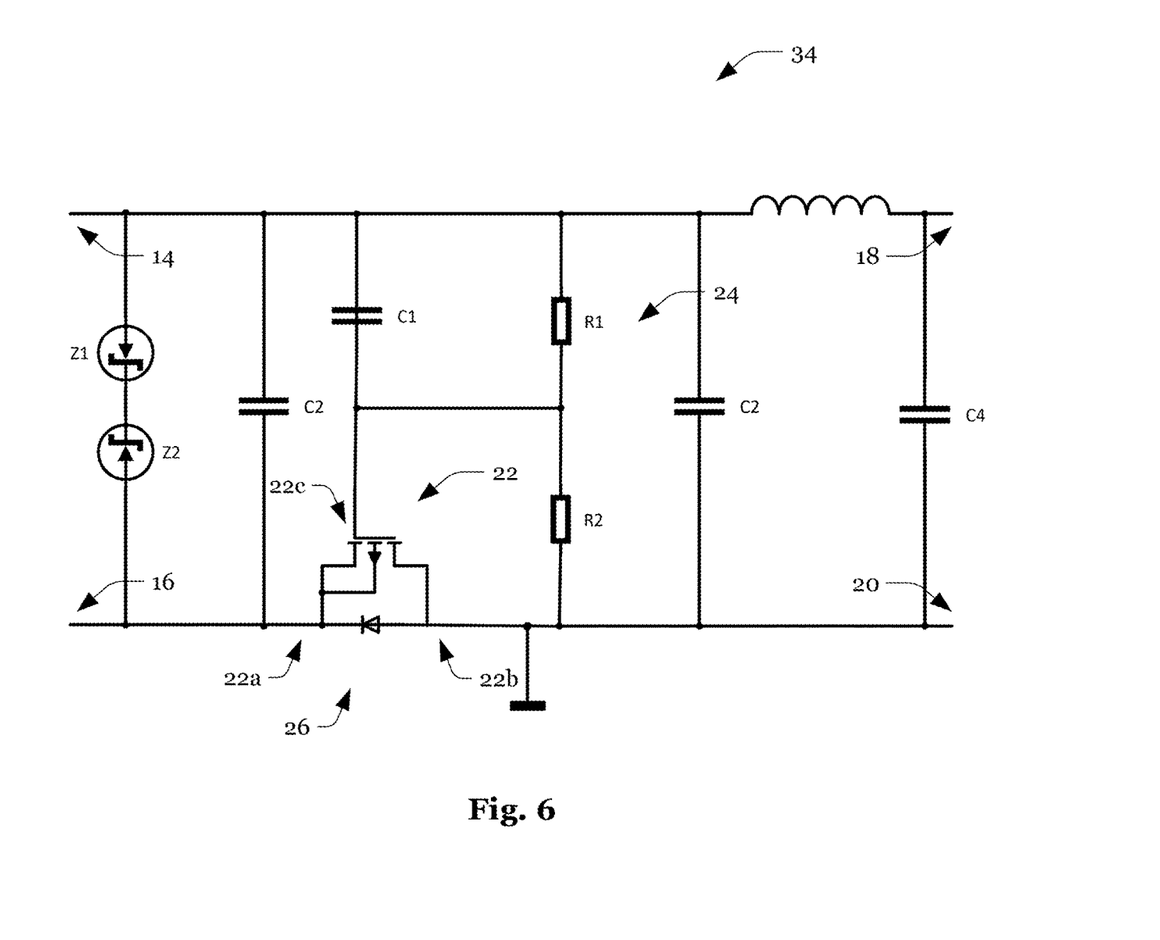
FIG. 6 shows an input circuit modified in comparison to the input circuit shown in FIG. 4.

Further, it is understood that, as shown in FIG. 6, the reverse polarity protection MOSFET 22 could also be arranged between the second terminal 16 and the fourth terminal 20 instead of being arranged between the first terminal 14 and the third terminal 18. In addition, it is understood that instead of the reverse polarity protection MOSFET 22, other semiconductor elements whose volume resistance can be controlled by means of voltage between two component terminals may also be used, wherein the use of FETs is only one possible embodiment of the inventive teaching.

Figure 7:
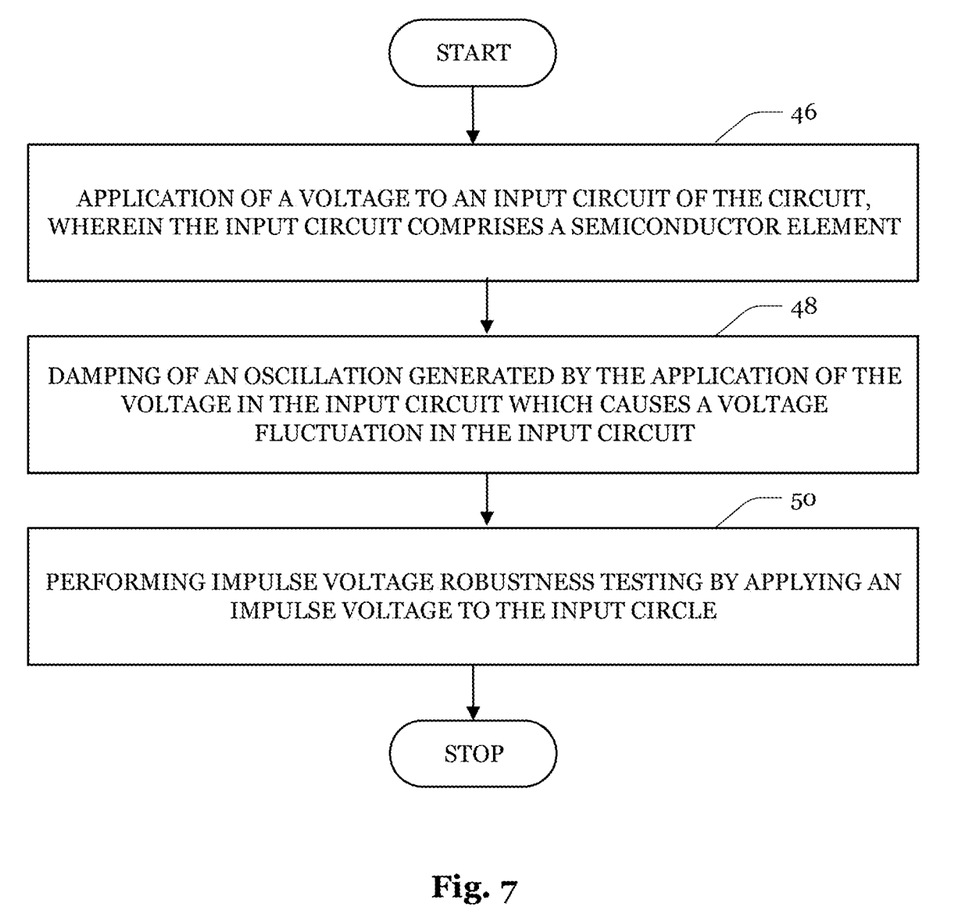
FIG. 7 shows a flowchart of a method for robustness testing of a circuit comprising a DC-to-DC converter.

FIG. 7 shows a flow chart of a method for testing a circuit for robustness against impulse voltages. The method starts with a step 46 of applying a voltage to the input circuit 34 of the circuit. The application of the voltage comprises, for example, as shown in FIG. 5, an increase in voltage between the first terminal 14 and the second terminal 16 from 0 V to a predetermined nominal value (e.g., 24 V).

The method proceeds with a step 48 of damping an oscillation generated by applying the voltage in the input circuit 34, which causes a voltage fluctuation in the input circuit 34. As described in connection with FIGS. 3 and 5, the damping serves to avoid a drop in the input voltage 30 below an undervoltage shut-off threshold of a device switched downstream of the input circuit 34 (e.g. a DC-to-DC converter) as well as to avoid reaching the input protection diode voltage.

The damping includes in particular the temporary increase in the volume resistance of a semiconductor element arranged in the input circuit 34 when the input voltage 30 drops, e.g., by ensuring that the drop of the gate-source voltage is accelerated with respect to the circuit shown in FIG. 2, so that the source-drain-path becomes highly resistive if the source potential 40 drops.

The method concludes with the step 50 of carrying out impulse voltage robustness testing by applying an impulse voltage to the input circuit 34.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit, comprising:
a DC-to-DC converter; and
an input circuit connected on a line side of the DC-to-DC converter, which has a first terminal and a second terminal for connection to a power supply and a third terminal and a fourth terminal for connection to the DC-to-DC converter;
wherein the input circuit has a semiconductor element arranged between the first terminal and the third terminal, an input voltage being applied by the input circuit,
wherein a first component terminal of the semiconductor element is connected to a second component terminal of the semiconductor element by a first capacitor and a second capacitor,
wherein a resistance of the semiconductor element is controllable by a voltage applied between the first component terminal and the second component terminal, and
wherein the voltage applied between the first component terminal and the second component terminal of the semiconductor element drops at substantially a same slope as the input voltage.

2. The circuit according to claim 1, wherein the semiconductor element is a field effect transistor (FET) or as a reverse polarity protection semiconductor switch.

3. The circuit according to claim 2, wherein a gate terminal of the FET is connected to a first component terminal of the first capacitor and is connected to a source terminal of the FET by a resistor of a voltage divider circuit connected in parallel with the first capacitor, wherein a second component terminal of the first capacitor and a second component terminal of a second capacitor are connected to the second terminal, and wherein a source terminal of the FET is connected to a first component terminal of the second capacitor.

4. The circuit according to claim 2, wherein the FET is configured as a metal oxide semiconductor field effect transistor (MOSFET).

5. The circuit according to claim 1, wherein the first component terminal is a gate terminal of the semiconductor element and the second component terminal is a source terminal of the semiconductor element, and
wherein the gate terminal is connected to the source terminal via the first capacitor and the second capacitor disposed in series between the gate terminal and the source terminal.

6. The circuit according to claim 1, wherein the first component terminal is a gate terminal of the semiconductor element and the second component terminal is a source terminal of the semiconductor element, and
wherein the voltage applied between the source terminal and the gate terminal increases the resistance of the semiconductor element.

7. The circuit according to claim 1, wherein a first component terminal of the first capacitor is separated from the third terminal by a resistor or the semiconductor element.

8. The circuit according to claim 1, wherein the first capacitor discharges toward the first component terminal, the first component terminal being a gate terminal of the semiconductor element.

9. A system, comprising:
a DC-to-DC converter; and
an input circuit connected on a line side of the DC-to-DC converter, which has a first terminal and a second terminal for connection to a power supply and a third terminal and a fourth terminal for connection to the DC-to-DC converter;
an impulse voltage generator, which has decoupling inductances,
wherein the input circuit has a semiconductor element arranged between the first terminal and the third terminal,
wherein a first component terminal of the semiconductor element is connected to a second component terminal of the semiconductor element at least by a first capacitor and a second capacitor,
wherein a resistance of the semiconductor element is controllable by a voltage applied between the first component terminal and the second component terminal, and
wherein the first terminal is connected to a first pole of the impulse voltage generator and the second terminal is connected to a second pole of the impulse voltage generator.

10. The system according to claim 9, wherein the first capacitor and the second capacitor are configured to dampen an oscillation generated by applying an input voltage to the DC-to-DC converter in a resonant circuit comprising the decoupling inductances by increasing the resistance of the semiconductor element as a function of the voltage fluctuation, wherein the damping is configured to avoid an undervoltage shut-off of the DC-to-DC converter and/or an overload at an input protection diode.

11. A method for testing a circuit for robustness against impulse voltages, comprising:
applying a voltage to an input circuit of the circuit, wherein the input circuit has a semiconductor element; and
damping an oscillation generated by applying the voltage in the input circuit, which causes a voltage fluctuation in the input circuit,
wherein the damping comprises an increase in the resistance of the semiconductor element controlled by the voltage fluctuation, the semiconductor element providing volume resistance for an LC resonant circuit of the circuit.

12. The method according to claim 11, wherein the semiconductor element is configured as a field effect transistor or as a reverse polarity protection semiconductor switch.

13. The method according to claim 12, wherein the increase in the resistance controlled by the voltage fluctuation comprises a voltage fluctuation-dependent reduction of a gate-source voltage applied to the semiconductor element, and
wherein the gate-source voltage drops at substantially a same slope as the voltage to the input circuit.

14. The method according to claim 12, wherein a drain terminal of the field effect transistor (FET) is connected to a first pole of a voltage source,
wherein a gate terminal of the FET is connected by a capacitor to a second pole of the voltage source, and
wherein a temporal acceleration of a drop in the gate potential is brought about by discharging the capacitor via a resistor.

15. A circuit comprising:
a DC-DC converter; and
an input circuit connected upstream of the DC/DC converter, the input circuit having a first connection and a second connection for connection to a power supply and a third connection and a fourth connection for connection to the DC voltage converter,
wherein the input circuit has a semiconductor element with a first component terminal of the semiconductor element that is connected to a second component terminal of the semiconductor element via a first capacitor and a second capacitor,
wherein the input circuit includes at least the first capacitor, the second capacitor, and one or more resistors which operate to control a volume resistance of the semiconductor element via a first voltage between the first component connection and the second component connection of the semiconductor element, the input circuit dampening a voltage fluctuation generated by applying an input voltage to the input circuit when testing the input circuit for robustness against surge voltages in the input circuit, the dampening by the input circuit generating an increase in the volume resistance controlled by the voltage fluctuation, and
wherein the input circuit operates to dampen the voltage fluctuation by temporarily increasing the volume resistance to dampen a negative half-wave of an oscillation of the voltage fluctuation.

* * * * *